United States Patent
Depond et al.

(10) Patent No.: US 9,684,036 B2
(45) Date of Patent: Jun. 20, 2017

(54) METHOD AND DEVICE FOR CHARACTERIZING A MODULE FOR STORING ENERGY VIA A CAPACITIVE EFFECT

(71) Applicant: BLUE SOLUTIONS, Ergue Gaberic (FR)

(72) Inventors: Jean-Michel Depond, Quimper (FR); Karine Lebras, Plougastel Daoulas (FR)

(73) Assignee: BLUE SOLUTIONS, Ergue Gaberie (FR)

( * ) Notice: Subject to any disclaimer, the term of this patent is extended or adjusted under 35 U.S.C. 154(b) by 123 days.

(21) Appl. No.: 14/651,732

(22) PCT Filed: Dec. 13, 2013

(86) PCT No.: PCT/EP2013/076557
§ 371 (c)(1),
(2) Date: Jun. 12, 2015

(87) PCT Pub. No.: WO2014/095640
PCT Pub. Date: Jun. 26, 2014

(65) Prior Publication Data
US 2015/0331053 A1 Nov. 19, 2015

(30) Foreign Application Priority Data
Dec. 18, 2012 (FR) .................................... 12 62225

(51) Int. Cl.
*G01N 27/416* (2006.01)
*G01R 31/36* (2006.01)
*G01R 19/25* (2006.01)

(52) U.S. Cl.
CPC ......... *G01R 31/36* (2013.01); *G01R 31/3624* (2013.01); *G01R 31/3648* (2013.01); *G01R 19/2509* (2013.01)

(58) Field of Classification Search
CPC ............ G01R 31/3658; G01R 31/3648; G01R 31/3627; G01R 31/3662; G01R 31/3631; Y02E 60/12

USPC ........................................................ 324/426
See application file for complete search history.

(56) References Cited

U.S. PATENT DOCUMENTS

| | | |
|---|---|---|
| 5,963,016 A | 10/1999 | Arai et al. |
| 6,201,373 B1 | 3/2001 | Arai et al. |
| 2001/0015634 A1* | 8/2001 | Shirakawa ............ H02J 7/0013 320/110 |
| 2002/0117997 A1* | 8/2002 | Feil ..................... G01R 31/3648 320/132 |
| 2002/0195999 A1* | 12/2002 | Kimura .............. G01R 31/3624 320/134 |
| 2006/0181245 A1 | 8/2006 | Mizuno et al. |
| 2008/0309295 A1 | 12/2008 | Kotz et al. |
| 2009/0001966 A1* | 1/2009 | Liu ........................ G01D 5/145 324/207.2 |
| 2011/0204898 A1* | 8/2011 | Kim ................... G01R 19/2506 324/434 |
| 2013/0093400 A1 | 4/2013 | Maynard et al. |

FOREIGN PATENT DOCUMENTS

FR 2944358 10/2010

* cited by examiner

*Primary Examiner* — Arun Williams
(74) *Attorney, Agent, or Firm* — Greer, Burns & Crain, Ltd.

(57) ABSTRACT

A device is provided for characterising at least one element for storing energy via a capacitive effect. The device includes a measuring component for measuring the voltage across the terminals of the storing element and another measuring component for measuring the current flowing through the storing element, having response times of the same order of magnitude. The device includes a controller for controlling the measuring component and a calculator for calculating a statistical quantity from the measurements taken. The controller is configured to control the measuring component so that the voltage-measurement period and the current-measurement period overlap temporally by at least 70%, especially 90%, of a total period including the voltage and current-measurement periods. A method is also provided for characterising an element for storing energy via a capacitive effect and to an assembly including at least one element for storing energy via a capacitive effect and a characterising device.

17 Claims, 3 Drawing Sheets

METHOD AND DEVICE FOR CHARACTERIZING A MODULE FOR STORING ENERGY VIA A CAPACITIVE EFFECT

BACKGROUND

The present invention relates to a method and a device for characterizing at least one element for storing energy via capacitive effect.

The fie d of the invention is the field of determining a characterizing indicator for energy storing means via capacitive effect, and more particularly the field of electrochemical energy storing means via capacitive effect, and even more particularly the field of the energy storage means commonly called supercapacitors or ultracapacitors.

It had been thought that an electrochemical energy storing element via capacitive effect in theory physically behaves like a perfect capacitor of capacitance C. But experience has shown that many interference phenomena arise within the electrochemical element. Experience has also shown that the single really significant interference effect at the usage ranges of the storage element is the loss of energy by the joule effect. This phenomenon is modelled by adding in an equivalent series resistance (ESR) in series with the perfect capacitor of capacitance C.

For optimum safe operation of an application using one or more electrochemical energy storing elements vie capacitive effect, it is important to be aware of the indicators characterizing each storage element, such as the amount of energy stored by each storage element, also called state of charge (SOC) or a state of health (SOH) of each storage element.

Determining these indicators for each storage element depends on many intrinsic parameters, the most significant of which are the values for C and ESR. These different values each depend on other physical parameters such as pressure, temperature, etc. and on the changes in the storage element over time.

However, determining the values for C and ESR requires that the operational fluctuations of the storage element are taken into account.

Thus, in order to obtain the operational indicators of a storage element, the current methods and devices determine the values for C and ESR over specific ranges of operation, in which the storage element has a "perfectly" predictable behaviour; ranges that are difficult to produce or have a random character in standard operation. This is why the current methods and devices regularly apply specific procedures of the controlled current transition type +I/−I or −I/O for measuring ESR and the controlled charge or discharge type at constant current I for measuring C.

However, in most applications, these procedures are difficult to envisage/apply while the application using the storage element is in operation, such as for example a motor vehicle application. Moreover, these procedures do not allow measurements to be obtained in real time and under real conditions, i.e. in situ.

As a result, the current methods and devices do not make it possible to characterize a capacitive storage element in situ, under real operating conditions without having to stop the application using the storage element, regardless of the application using the storage element.

SUMMARY

The purpose of the invention is to overcome the abovementioned drawbacks.

Another purpose of the invention is to propose a method and a device making it possible to characterize an element for storing energy via capacitive effect under real operating conditions, without having to stop the application using the storage element or having to implement a particular protocol.

Another purpose of the invention is to propose a method and a device making it possible to characterize an element for storing energy via capacitive effect in situ.

Finally, another purpose of the invention is to propose a method and a device making it possible to characterize an element for storing energy via capacitive effect that can be utilized regardless of the application using said means.

The invention makes it possible to achieve at least one of the abovementioned aims using a device for characterizing at least one element for storing energy via capacitive effect, in particular a supercapacitor, also called an ultracapacitor, and in particular for determining an item of data relating to a state of health (SOH) and/or an item of data relating to a state of charge (SOC) of said energy storage element, said device comprising:

at least one voltage measurement module comprising at least one means of measurement, called voltage sensor, of a voltage of said element;

at least one current measurement module comprising at least one means of measurement, called current sensor, of a current of said element, said voltage measurement and current measurement modules being configured to carry out measurements with response dynamics of the same order of magnitude, i.e. the unit-step responses of said modules are of the same temporal order of magnitude;

at least one control means of said measurement module for carrying out, for each storage element, at least one measurement cycle comprising:
  a series of voltage measurements at the terminals of said storage element over a time period, called voltage measurement period, and
  a series of measurements of current passing through said storage element over a time period, called current measurement period; and at least one means of statistical calculation of a variable relating to each storage element from measurements taken during at least one measurement cycle by said modules;

in which said at least one control means is moreover configured to control said measurement modules so that, for each storage element, said voltage measurement period and said current measurement period overlap in time for at least 70%, preferably 90%, of a time period, called the total period, comprising said measurement periods for said storage element.

By unit-step response of a measurement module is meant the measurement signal at the output of the module, denoted $S(t)$, obtained in response to an input signal in the form of a step, commonly denoted $\Gamma(t)$. By definition, $\Gamma(t)=0$ if $t<0$ and $\Gamma(t)=1$ if $t \geq 0$.

According to the principles of construction of a measurement module, $S(t)$ tends towards a constant $S_\infty$ called the stabilized or stationary measurement value. This value acts as a reference for defining the main temporal features of the unit-step response such as for example:

the response time, denoted τhd r, which is defined as the time necessary for the measurement signal to remain within the interval ±5% around the stabilized value $S_\infty$:

$$T_r = \text{Min}\{T / \forall\, t \geq T, \left|\frac{S(t)-S_\infty}{S_\infty}\right| \leq 5\%\},$$

the rise time, denoted $\tau_m$, which is defined as the time necessary for the measurement signal to pass from 10% to 90% of the stabilized value $S_\infty$:

$$\tau_m = t_{90\%} - t_{10\%}$$

with $S(t_{10\%}) = 10\%\, S_\infty$ and $S(t_{90\%}) = 90\%\, S_\infty$ the delay time, denoted $\tau_d$, which is defined as the time necessary for the measurement signal to reach 50% of the stabilized value $S_\infty$:

$$\tau_d / S(\tau_d) = 50\%\, S_\infty.$$

It is considered that two unit-step responses are of the same order of magnitude it with regard to a characteristic time $\delta t_m$ of the measurement cycles, namely the minimum of the time periods between two voltage measurements and of the time periods between two current measurements during the measurement cycles, the unit-step responses of the voltage measurement module $S_U(t)$ and that of the current measurement module $S_I(t)$, are linked by the following relationship:

$$\left|\frac{S_U(\delta t_m)}{S_{U\infty}} - \frac{S_I(\delta t_m)}{S_{I\infty}}\right| \leq 10\%$$

Preferably, the sensors are selected as follows:
the response time of the current and voltage sensors differ by less than 20%, in particular 10%, or
the rise and delay times of the current and voltage sensors differ respectively by less than 20%, in particular 10%.

In order to illustrate the notion of time overlap, a non-limitative example is shown when the series of measurements is taken over a total period of 1 s ranging from t=0 to t=1 s, the control means controlling:
the voltage measurement module in order to carry out a series of voltage measurements over a voltage measurement period ranging from t=0 to t=0.8 s, and
the current measurement module in order to carry out a series of current measurements over a current measurement period ranging from t=0.1 s to t=1 s.

In this case, the voltage measurement period and the current measurement period overlap in time for 0.7 s, from t=0.1 s to t=0.8 s, for a total period of 1 s, which gives an overlap of 70% of the total period.

The characterization device according to the invention makes it possible to carry out, for a storage element or individually for each storage element from a plurality of storage elements, a series of voltage and current measurements relating to one and the same time period of at least 70% of the total measurement period for this storage element.

In addition, the voltage and current measurements taken for a storage element have an equivalent timeframe. The physical realities measured both by the voltage and current measurement modules relating to one and the same storage element are equivalent in terms of time. In practice, this means that the output data of the voltage measurement and current measurement modules are equivalent, and in particular that the unit-step responses of the measurement modules are of the same temporal order of magnitude.

Based on these criteria, the voltage and current measurements taken for a given storage element are therefore statistically compatible, and take account of the operational fluctuations of the storage element naturally present in the operation of the storage element.

As a result, the device according to the invention makes it possible to carry out a characterization of each capacitive energy storage element without having to establish a specific procedure in order to take account of the operational fluctuations of a capacitive storage element. In addition, the current and voltage measurements taken by the device according to the invention can be taken in situ during the operation of the application using the storage means.

The device according to the invention therefore makes it possible to characterize a capacitive energy storage element, in situ, under real operating conditions, without having to stop the application using the storage element, regardless of the application using said element, including motor vehicle applications.

Advantageously, if $\delta t$ is the total measurement period, $\delta t \leq 1$ s can be an acceptable generic value in order to avoid the influence of the capacitance effect and determine ESR utilizing the conventional formula $U = ESR \times I$.

Advantageously according to the invention, $\delta t \leq 0.2$ s or even $\leq 0.05$ s when the performances of the voltage and current sensors make this possible.

The control means can be configured to control the current and voltage measurements so that at least one voltage and current measurement is taken in one and the same interval $\delta t \leq 0.1$ s.

Advantageously, the device makes it possible to characterize a plurality of storage elements. For each storage element, the device according to the invention comprises a voltage measurement module and current measurement module pair, configured to measure, respectively, the voltage at the terminals of this storage element and the current passing through this storage element.

A measurement module, of current or of voltage, of a pair associated with a storage element can form part of another pair associated with another storage element.

Advantageously, the control module can be configured to control a voltage, respectively a current, measurement module, in order to carry out a series of voltage, respectively current, measurements, at a measurement frequency greater than or equal to 10 Hz.

Preferentially, the control module can be configured to control a voltage, respectively current, measurement module, in order to carry out a series of voltage, respectively current, measurements, at a measurement frequency equal to 200 Hz.

Thus, the device according to the invention makes it possible to take account of the rapid variations in the state of the storage element even when it is a supercondenser capable of undergoing significant variations over a short period. As a result, the current measurements and the voltage measurements are not disconnected from each other, even if they are not exactly synchronous.

The sensors of the measurement module can preferably be selected to have a response time, as defined above, of less than 0.1 second, and preferably less than 0.005 second.

At least one current sensor can advantageously comprise:
a digital resistive sensor, or
a multi-range Hall effect sensor, or
a fluxgate magnetic sensor.

The digital resistive sensor, also called a digital shunt, has a high dynamic measurement range. It provides an accurate and almost instantaneous measurement of the current, with a typical response time of less than one millisecond. It must be placed in the electrical circuit supplying the storage element and therefore generates, among other things, an additional and unwanted electrical resistance, and additional problems in terms of behaviour at operational voltage.

The multi-range Hall effect sensor has a low dynamic measurement range. It provides a smoothed current measurement, with a typical response time between 50 and 100 milliseconds. By means of the different measurement ranges, the measured value is accurate. Unlike the digital shunt, there is no need to place it in the electrical circuit supplying the storage element, and it therefore offers more flexibility.

The fluxgate magnetic sensor has a dynamic range and a measurement accuracy equivalent to those of a digital shunt and has the same advantage as the multi-range Hall effect sensor in terms of positioning. However, the fluxgate sensor is more expensive compared with the digital resistive sensor or with the multi-range Hall effect sensor.

The proposed list of current sensors is not exclusive. Any current sensor offering a sufficiently accurate (the accuracy is generally specified by the application but ≤1% of the entire measurement range is a typically required value) and rapid measurement (typically ≤0.1 s) of the current over a representative range of the application using the storage element (typically a few milliamps—several hundreds of amps) and capable of withstanding promptly extreme currents as required (typically a few thousands to a few tens of thousands of amps) is a potential candidate.

At least one voltage sensor can comprise an analogue-to-digital converter configured to carry out an analogue-to-digital conversion of a voltage presented at its input.

An analogue-to-digital converter (ADC) has a high dynamic measurement range with a response time often very much less than one millisecond.

It may be necessary to adapt the input stage of the ADC, which is generally suitable for a voltage generally comprised between 0-5 V, in order to correspond to the changes in the voltage of the storage element. Such an adaptation can be produced by establishing a voltage division step in the voltage measurement module, at the input of the ADC.

Moreover, the choice of the ADC depends on the resolution necessary at the input, for example 1 bit for x mV, and at the output, for example 12 bits, 14 bits, etc. These resolutions can be set by selection of the calculation means and the accuracy of measurement required.

According to an embodiment, in order to obtain measurements having an equivalent timeframe, the device according to the invention can comprise one or more current sensors and one or more voltage sensors the dynamic responses of which are similar or equivalent or also of the same order, or even identical. For example in this variant, the device can comprise:
 for the voltage measurements: one or more ADC sensors, and
 for the current measurements: one or more digital shunts or one or more fluxgate magnetic sensors.

In fact, the ADC has a high dynamic measurement range, of the same order as that of a digital shunt or a fluxgate magnetic sensor. The timeframes of the voltage and current measurements are in this case equivalent.

In this case, each measurement module can comprise only the corresponding sensor.

According to another embodiment of the device according to the invention, at least one voltage, respectively current, measurement module associated with a storage element comprises at least one means for changing a response dynamic of the sensor of said module, by processing:

the electrical signal to be measured, supplied at the input of said sensor, and/or
a measurement signal supplied by said sensor;
so as to adjust the response dynamic of said voltage sensor, respectively current sensor, with respect to a response dynamic of the current sensor, respectively voltage sensor, of the current measurement module, respectively voltage measurement module, associated with said storage element.

In this way, the device according to the invention makes possible the availability of voltage and current measurements that are equivalent from a timeframe point of view at the output of the measurement modules.

In fact, in order to end up with equivalent measurements at the output of the voltage and current measurement modules associated with a storage element when the voltage sensor(s) and the current sensor(s) do not have the same dynamic response, for example when the voltage sensor is an ADC and the current sensor is a multi-range Hall effect sensor, one and/or the other of the measurement modules can comprise one or more means of processing the voltage/current which must be measured by the sensor or from the measurement signal supplied by the sensor.

These processing means can comprise filter means, such as analogue, digital filter means, sliding window filter, Fourier transform or temporal filter.

For example, the dynamic range of an ADC is significantly higher than that of a multi-range Hall effect sensor. The timeframes of the two measurements are not equivalent in this case. Filtering can be introduced in order to modify the unit-step response of the voltage measuring chain, so as to render the timeframes of the measurements equivalent. This filtering of the low-pass type, will reduce the dynamic measurement range of the voltage to the level of that of the current. There are several possibilities for carrying out this filtering, including the two following:
 a low-pass analogue filter of RC type positioned upstream of the ADC: the characteristic cut-off frequency is set by the unit-step response of the current sensor, in the knowledge that in the absence of an accurately-known unit-step characteristic, it is possible of adopt a value close to $1/\tau_r$ or $1/(\tau_d + \frac{1}{2}\tau_m)$ as the cut-off frequency. In this case, the processing is applied to the signal representing the voltage to be measured;
 a digital filter positioned downstream of the ADC: the mathematical processing, namely a low-pass digital filtering, sliding window filter, etc., ensures that the filtered measurement has the same timeframe as the current measurement. In this case, the processing is applied to the measurement signal supplied by the ADC.

These processing means can also be implemented to improve the accuracy of the measurements, for example a filter taking an average of several measurements makes it possible to reduce the time response of a sensor while increasing the accuracy of the measurement.

In a particular embodiment of the device according to the invention, the control module can be configured to control the voltage measurement module and the current measurement module associated with a storage element so as to carry out current and voltage measurements synchronously for this storage element.

Preferentially, the control module can be configured to control the voltage measurement module and the current measurement module associated with a storage element so as to carry out interleaved current and voltage measurements for this storage element.

In fact, synchronous measurements of current and voltage are difficult to carry out, while alternating/interleaved measurements of current and voltage are simpler to carry out.

According to the invention an "alternating measurement" or "interleaved measurement" is not limited to a repetition of a sequence, comprising measuring in turn one of the electrical variables then measuring the other electrical variable, of the type ([U, I, U, I] or [I, U, I, U]) with "U" the voltage and "I" the current. In fact, the alternation is not limited to a 1:1 ratio between voltage measurements and current measurements, i.e. one voltage measurement per current measurement, and covers the case of several voltage, respectively current, measurements, per current, respectively voltage measurement.

In addition, according to the invention an "alternating measurement" can be regular or not, i.e. the time between two consecutive current measurements or two consecutive voltage measurements or also between one consecutive current measurement and one voltage measurement can be constant or changing.

According to the invention, the control means can advantageously be configured not to exceed a ratio defined by two voltage, respectively current, measurements, for one current, respectively voltage measurement, i.e. (2 U: 1 I) or (1 U: 2 I).

The device according to the invention can moreover comprise a module for the measurement of the quantity of charge, comprising a means of measuring a quantity of charge, called a charge sensor, for at least one, advantageously each, storage element.

Such a charge sensor can be an integrator of a current signal supplied by a current sensor. It can be independent of the current sensor.

Advantageously, the control means can moreover be configured to Control the measurements of current I, voltage U and quantity of charge Q, so that at least one measurement of each of the parameters U, I and Q are taken in one and the same interval $\delta t < 0.1$ s.

It will also be noted that the measurements relating to the charge are carried out over much longer periods of time (approximately a few seconds) than the periods $\delta t$ mentioned previously, in order to take account of the capacitive effect.

Advantageously, the device according to the invention can moreover comprise a buffer memory for storing at least a part of the values measured by the measurement module during a series of measurements, in particular the voltage and current values and optionally temperature and/or pressure values, and/or at least a part of the values calculated by the calculation means, and optionally in association with an identifier of a storage element. The pairs of values measured concomitantly are associated in the buffer memory.

The storage can be produced in digital form.

The sampling rate $v_{sample}$ of the signal to be measured can be selected so as that:

10 sample/s ≤ $v_{sample}$ ≤ 2500 sample/s.

For one and the same measurement cycle, the number of voltage measurements of the series of measurements can be equal to, or different from, the number of current measurements of the series of measurements.

For two different measurement cycles, the number of voltage, respectively current, measurements can be identical or not.

In a particular embodiment, for a given measurement cycle, the number N of measurements of voltages can be equal to the number of measurements of current.

According to a particular embodiment, N can be selected such that $2 \leq N \leq 32$. Such a number of measurements offers a good compromise between statistical accuracy and calculation power.

Advantageously, the number of measurements N can be, non-limitatively, a number equal to a power of 2. Such a number of measurements makes it possible to optimize the calculations of the statistical variables.

The calculation means can be configured to carry out a determination of at least one intermediate statistical variable. Such an intermediate statistical variable can be for example a variance, a standard deviation or an average, relating to the voltage or the current.

For an electrical variable denoted G, considering N to be the number of measurements of the electrical variable:

the average $\overline{G}$ can be calculated by using the following relationship:

$$\overline{G} = \frac{1}{N} \sum_{1}^{N} G_i$$

the variance $\text{var}_G$ can be calculated by using the following relationship:

$$\text{var}_G = \frac{1}{N} \sum_{1}^{N} (G_i - \overline{G})^2 = \frac{1}{N} \sum_{1}^{N} G_i^2 - \overline{G}^2$$

the standard deviation denoted $\sigma_G$ can be calculated by using the following relationship:

$$\sigma_G = \sqrt{\text{var}_G} = \sqrt{\frac{1}{N} \sum_{1}^{N} (G_i - \overline{G})^2} = \sqrt{\frac{1}{N} \sum_{1}^{N} G_i^2 - \overline{G}^2}$$

For a given storage element, the calculation means can thus be configured for or be suitable for supplying six values, namely: $\overline{U}$, $\text{var}_U$, $\sigma_U$, $\overline{I}$, $\text{var}_I$ and $\sigma_I$, with U the voltage and I the current.

According to a particular embodiment, called direct calculation mode in the rest of the application, the calculation means can be configured to calculate statistically at least one statistical variable from values measured by the measurement modules over a single measurement cycle.

The statistical variables calculated can then comprise ESR or C determined with the following relationships:

$$\sigma_U = \text{ESR} \times \sigma_I$$

$$\text{var}_U = \text{ESR}^2 \times \text{var}_I$$

and $$\Delta Q_{1 \rightarrow 2} = \int_{t_1}^{t_2} I(t) \, dt = C \times (V(t_2) - V(t_1)) = C \times \Delta V_{1 \rightarrow 2}$$

$$\Delta Q_{1 \rightarrow 2} = C \times (\Delta U_{1 \rightarrow 2} - \text{ESR} \times \Delta I_{1 \rightarrow 2})$$

with Q the quantity of charge.

This direct calculation mode gives relatively satisfactory results but has the drawback of being particularly sensitive in the case where the values of the statistical variables calculated are small. Moreover, this direct calculation mode is very sensitive to the inherent measurement inaccuracies of the sensors which can add to the natural fluctuations of the physical variables.

In this embodiment, the time interval for which the statistical variable is calculated can correspond to the time interval over which a series of measurements is taken.

Preferably the time interval for which the statistical variable is calculated, with particular reference to ESR, can be less than 1 s, in particular equal to 0.1 s.

According to another particular embodiment, called indirect calculation method, the calculation means can be configured to calculate statistically at least one statistical variable from values measured by the measurement modules over a plurality of measurement cycles, and optionally stored in storage means.

In this embodiment, the calculation means can take account of several series of voltage and current measurements previously taken and stored, for example via a linear regression model.

Taking account of a measurement cycle carried out beforehand can be done either by considering the values of the measurements taken during this measurement cycle or by considering the values of the variables calculated statistically for this measurement cycle. Thus, according to an embodiment, at least one statistical variable can be determined by taking account, in a linear regression model, of the statistical variables calculated during a plurality of measurement cycles.

The indirect calculation can take account, in a sliding manner, of a predetermined number of measurements previously taken and stored in storage means, these measurements being able to be taken over at least two measurement cycles. This means to take account, in a sliding manner, of a predetermined number of measurements previously taken. In the latter case, the storage means can be configured for storing only a predetermined number of measurements previously taken.

Advantageously, the device according to the invention can comprise means of comparison for comparing values measured and/or calculated with stored values, for example in the buffer memory, previously measured or calculated, the new measured and/or calculated values being stored, for example in the buffer memory, as a function of the results supplied by the comparison means.

When the values obtained during a measurement or a calculation are identical or similar to previously measured or calculated stored values, then the new measured/calculated values cannot be stored.

Such a comparison makes it possible to avoid storing identical or similar measured/calculated values several times and thus to better manage the storage means.

The device according to the invention can moreover comprise at least one means of measuring other parameters relating to each energy storage element, in particular to the environment of each energy storage element, such as for example the temperature or pressure.

The device can then comprise at least one means for converting the data measured under actual conditions into data measured under reference conditions. These conversion means can for example comprise a conversion table constructed as a function of data obtained experimentally and stored in storage means. The conversion can be carried out either before the calculation of one or more statistical variables or afterwards.

According to another aspect of the invention, a system is proposed comprising:

a plurality of elements for storing energy via capacitive effect mounted in series and/or in parallel, and a characterization device according to the invention, supplying at least one item of characterization data for at least one of said energy storage elements.

The energy storage assembly can moreover comprise a means for modifying a balance or a use of the storage elements as a function of at least one item of data supplied by the characterization device.

By "balancing" is meant the action of homogenizing the voltage distribution within an energy storage assembly. In particular, the aim is for all the capacitive energy storage elements mounted in series in one and the same branch to have at any moment the same voltage value at their terminals, while nevertheless typically allowing a leakage of a few tens of millivolts.

A modification of balancing can comprise a total or partial rerouting of the current passing through an energy storage element the unit voltage of which is considered too high with respect to an expected nominal value. Modifying the balance amounts, in this case, to modifying the rerouting of the current passing through the energy storage element in question. But this example is non-limitative with respect to other methods resulting in the balancing of an energy storage assembly.

Advantageously, the characterization device according to the invention can be used for characterizing individually each energy storage element of the storage assembly comprising a plurality of energy storage elements mounted in series or in parallel.

In the case of a storage assembly comprising several storage elements mounted in series and/or in parallel, the device according to the invention can comprise:

a current measurement module for at least one of the parallel branches of the circuit linking said storage elements together, a voltage measurement module for each storage element, and optionally for at least one parallel branch of the circuit linking said storage elements together.

It can also or alternatively comprise a voltage measurement module at the terminals of the energy storage module and means of measuring the current at the output of the energy storage module.

A series of voltage, respectively current, measurements, taken for a storage element can be carried out at the same time or not as a voltage, respectively current, series of measurements, for another storage element forming part of said storage module.

According to another aspect of the invention, a method is proposed for characterizing at least one at least one element for storing energy via capacitive effect, in particular a supercapacitor also called an ultracapacitor, in particular for determining an item of data relating to a life cycle (SOH) or to a state of charge (SOC) of said energy storage element, said method comprising, for each storage element:

at least one iteration of the following steps constituting a measurement cycle:

a series of voltage measurements taken by a voltage measurement module comprising at least one measurement means, called voltage sensor, of a voltage at the terminals of said storage element, and a series of current measurements taken by a current measurement module comprising at least one measurement means, called current sensor, of a current passing through said storage element; and a step of statistical calculation of a variable relating to said storage element from said voltage and current measurements; in which said series of voltage measurements and current measurements are carried out over two measurement periods which overlap in time at least over 70%, preferably 90%, of a period, called total period, comprising said measurement periods, the measurements being carried out using voltage and current measurement modules having response dynamics of the same order of magnitude.

In particular, the voltage measurements and the current measurements of one and the same measurement cycle can be taken at one and the same frequency or at two substantially equal frequencies.

Advantageously, the voltage measurements of a series of measurements or the current measurements of a series of measurements can be taken at a frequency greater than or equal to 10 Hz.

Preferentially, the voltage measurement frequency and/or the current measurement frequency can be 200 Hz.

The method according to the invention can moreover comprise at least one step of modification of a response dynamic of at least one voltage sensor or one current sensor, in order to obtain statistically compatible voltage and current measurements, said modification step comprising at least one processing:
of the electrical voltage or current to be measured supplied at the input of said sensor,
of a measurement signal supplied at the output by said sensor.

For a measurement cycle, the series of current measurements and the series of voltage measurements can be taken so that the voltage measurements and the current measurements are taken in an alternating/interleaved manner.

The method according to the invention can moreover comprise a step of storing, in a buffer memory, at least a part of the voltage and/or current values measured during a series of measurements of a measurement cycle.

The method according to the invention can comprise a determination of at least one intermediate statistical variable. Such an intermediate statistical value can be for example a variance, a standard deviation or an average, as regards the voltage or the current.

In the method according to the invention, at least one statistical variable can be calculated by taking account:
of the measurements taken during a single measurement cycle,
of the measurements taken during a plurality of measurement series, or
in a sliding manner, a number of measurements previously taken.

Generally, the method of characterization according to the invention can moreover comprise one, or any combination, of the steps/operations carried out by the device according to the invention and described above, with or independently of the architecture of said device, if there is no technical objection to such a combination. These characteristics will not be repeated or detailed here to avoid overcomplicating the description.

According to another aspect of the invention a method of managing an energy storage assembly is proposed, comprising a plurality of elements for storing energy via capacitive effect mounted in series and/or in parallel.

Such a management method comprises:
at least one step of determining, in accordance with the method of characterization according to the invention, at least one item of characterization data for east one of said energy storage elements, and
at least one step of modifying, as a function of said at least one item of characterization data, a balancing or a use of at least one storage element of said storage assembly.

Generally, the management method according to the invention can moreover comprise one, or any combination, of the steps/operations carried out by the storage assembly according to the invention and described above, with or independently of the architecture of said assembly, if there is no technical objection to such a combination. These characteristics will not be repeated or detailed here to avoid overcomplicating the description.

BRIEF DESCRIPTION OF THE DRAWINGS

Other advantages and features will become apparent on examination of the detailed description of examples that are no way imitative and of the attached drawings in which.

DETAILED DESCRIPTION

Figure 1:
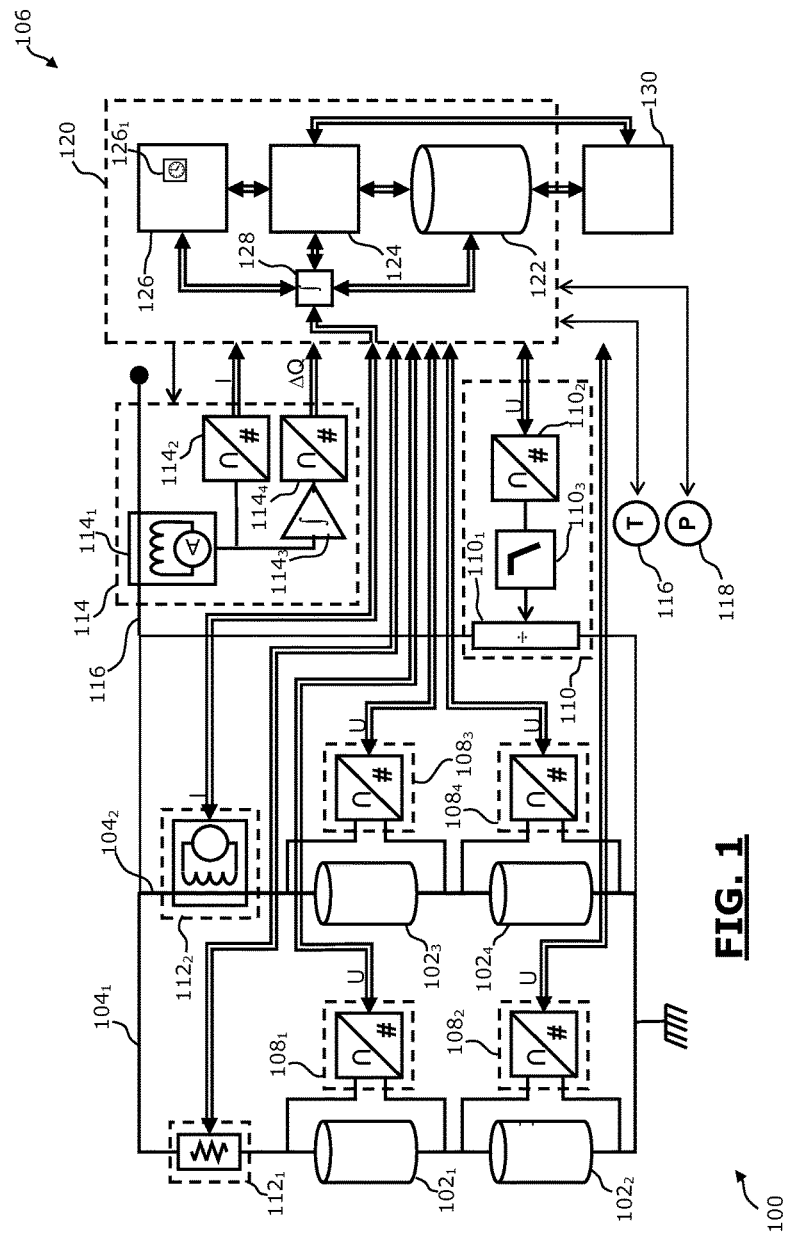
FIG. 1 is a diagrammatic representation of a storage assembly according to the invention.

It is well understood that the embodiments that will be described hereinafter are in no way limitative. Variants of the invention can in particular be envisaged comprising only a selection of the features described below in isolation from the other described features, if this selection of features is sufficient to confer a technical advantage or to differentiate the invention with respect to the state of the prior art. This selection comprises at least one preferably functional feature without structural detail, or with only a part of the structural details if this part alone is sufficient to confer a technical advantage or to differentiate the invention with respect to the state of the prior art.

In particular, all the described variants and embodiments can be combined if there is no objection to this combination from a technical point of view.

In the figures, the elements common to several figures retain the same references.

Firstly, non-limitative examples will be described of the calculation of statistical variables according to two methods of calculation of static parameters. Each of these embodiments can be implemented in the invention, alone or in combination with the one another.

Embodiment 1: Direct Calculation

Let N be the number of voltage "U" and current "I" values measured in a measurement cycle, and over a total period $\delta t$ with $\delta t \ll 1$ s. The N values are distributed, for example, homogenously over the measurement period $\delta t$, typically by interleaving the taking of measurements of U and of I, as explained above.

It will be noted that with the device according to the invention, even if the measurements are not taken homogenously, pairs of values are found, to be processed by the calculation means at the output of the current and voltage modules (by means of the processing carried out additionally by the processing means of each of the modules).

The average of the variations of a variable G corresponds statistically to the standard deviation $\sigma_G$ of this variable, or to its variance $\text{var}_G = \sigma_G^2$ if viewed in terms of mathematical distance, and the statistical variables calculated comprise in particular the variance or the standard deviation of the voltage and/or of the current.

The averages $\overline{U}, \overline{I}$ on the one hand, and the variances $\text{var}_U$, $\text{var}_I$ and/or the standard deviations $\sigma_U$, $\sigma_I$ of U and I are determined by means of the method and device according to the invention, utilizing the following relationships:

$$\overline{G} = \frac{1}{N}\sum_1^N G_i$$

$$\text{var}_G = \frac{1}{N}\sum_1^N (G_i - \overline{G})^2 = \frac{1}{N}\sum_1^N G_i^2 - \overline{G}^2$$

$$\sigma_G = \sqrt{\text{var}_G} = \sqrt{\frac{1}{N}\sum_1^N (G_i - \overline{G})^2} = \sqrt{\frac{1}{N}\sum_1^N G_i^2 - \overline{G}^2}$$

The device and method according to the invention are therefore capable of providing 6 values, determined by the calculation means during the calculation step, for each period of $\delta t$: $\overline{U}$ $\text{var}_U$, $\sigma_U$ on the one hand, and $\overline{I}$, $\text{var}_I$ and $\sigma_I$ on the other hand. Three of these values are stored, for example in buffer memory, for future calculation of ESR and C: $\overline{I}$ and by selection the pair ($\text{var}_U$, $\text{var}_I$) or ($\sigma_U$, $\sigma_I$).

Calculation of ESR

The value of ESR can then be calculated, by the calculation means during the calculation step, by using one of the following relationships as a function of the stored pairs of data:

$$\sigma_U = \text{ESR} \times \sigma_I$$

$$\text{var}_U = \text{ESR}^2 \times \text{var}_I$$

For this embodiment, the time interval for which the statistical variable ESR is calculated corresponds to the time interval over which a series of measurements is taken, i.e. the period of a measurement cycle, and is therefore preferably less than 1 s, in particular to 0.1 s.

Calculation of C

The value of C can be obtained by taking the same measurements of I and U, and/or the calculations of the statistical variables $\overline{I}$ and $\overline{U}$, obtained previously during the calculation of ESR, and applying to them the following equations:

$$\Delta Q_{1\to 2} = \int_{t_1}^{t_2} I(t)\,dt = C \times (V(t_2) - V(t_1)) = C \times \Delta V_{1\to 2}$$

$$\Delta Q_{1\to 2} = C \times (\Delta U_{1\to 2} - \text{ESR} \times \Delta I_{1\to 2})$$

in which:
- $\Delta Q$ corresponds to a difference in the quantity of charge in the storage element between two states ①and ②, also measured by a charge sensor;
- $\Delta U$ corresponds to a voltage difference at the terminals of the storage element, i.e. a numerical difference of U or $\overline{U}$, between the states ①and ②;
- ESR corresponds to the value calculated previously, and
- $\Delta I$ originates from the numerical difference of I or $\overline{I}$ between the states ①and ②.

In order to improve the accuracy of the calculation, the states ①and ②of the storage element can be chosen to be separated, either in terms of time, or in terms of quantity of charge, or in terms of voltage, in order to obtain values of "$\Delta Q$" and/or of "$\Delta U - \text{ESR} \times \Delta I$" sufficiently far from 0, while remaining within a field of variation representative of the application using the storage element.

In terms of time, the states ①and ②can for example be separated such that $2\,\text{s} \leq \Delta t_{1\to 2} \leq 64\,\text{s}$, and in particular $4\,\text{s} \leq \Delta t_{1\to 2} \leq 16\,\text{s}$.

In terms of quantity of charge, the states ①and ②can for example be separated such that $C_n \times U_n/32\,\text{coulomb} \leq |\Delta Q_{1\to 2}| \leq C_n \times U_n\,\text{coulomb}$, where Cn is the nominal capacitance of the storage element and $U_n$ the nominal operating voltage of the storage element, and in particular $C_n \times U_n/16\,\text{coulomb} \leq |\Delta Q_{1\to 2}| \leq C_n \times U_n/4\,\text{coulomb}$.

In terms of voltage, the states ①and ②can for example be separated such that $U_n/32\,\text{V} \leq |\Delta V_{1\to 2}| \leq U_n\text{V}$, and in particular $U_n/16\,\text{V} \leq |\Delta V_{1\to 2}| \leq U_n/4\,\text{V}$.

It may be beneficial to be able to reset the measurement of $\Delta Q$, to zero on command. In this case, the state ④can correspond to the reset and the state ②to the measurement of $\Delta Q$.

It will be noted that, regardless of the method of calculation or the embodiment for determining $\Delta Q$, a quantity of charge sensor can be included in the electrical circuit to which the storage element is linked, instead of the calculation carried out by the calculation means from the measurements of I or $\overline{I}$.

$\Delta Q$ is then obtained directly from this sensor.

Such a charge sensor can be an integrator of the current passing through the storage element. It can constitute a specific sensor, placed in series with a current sensor. For example, certain digital shunts supply directly, from the digital integration of the internal measurement signal, the quantity of charge which has passed through the shunt since a controllable reset.

In a variant, the presence of the current sensor can be put to use to produce such a charge sensor by analogue or digital integration of the signal originating from the current sensor, as a function of the nature of the output signal of the current sensor. For example, a multi-range Hall effect sensor generally supplies an analogue signal that is better integrated by analogue means via a dedicated integrator circuit. Conversely, a fluxgate magnetic sensor generally supplies a digital signal that is better integrated by digital means via a calculation means, dedicated or not. In this variant embodiment, it may be beneficial to dedicate a calculation means, a microcontroller for example, and/or a data storage means with digital integration of the output signal of the current sensor, due to the fact that this calculation may result in high consumption of resources. If the output signal is analogue, an intermediate ADC can convert the signal so that it can be used by the dedicated calculation and/or storage means.

Advantageously, regardless of the embodiment when the variable $\Delta Q$ is measured using a charge sensor, the command means can moreover be configured to control the measurements of I, of U and of Q, so that at least one measurement of U, I and of Q is taken within one and the same interval $\delta t<0.1\,\text{s}$.

As detailed above, this embodiment gives relatively satisfactory results but, has the drawback of being particularly sensitive in the case where the values of $\text{var}_I$ or $\overline{I}$ are small.

Moreover, this calculation mode is sensitive to the inherent measurement inaccuracies of the sensors which can add to the natural fluctuations of the physical variables.

Embodiment 2: Indirect Calculation

In this embodiment, a linear regression is carried out from the measurements taken and/or from the statistical variables calculated, stored in the storage means of the device, and correspond to k measurement cycles taken beforehand.

Calculation of ESR

The relationship used to carry out the linear regression can be as follows:

$$a = \frac{\frac{1}{k}\sum_1^k X_i Y_i - \overline{X}\,\overline{Y}}{\text{var}_x} = \frac{\sum_1^k (X_i - \overline{X})(Y_i - \overline{Y})}{\sum_1^k (X_i - \overline{X})^2}$$

By taking the pair $(\text{var}_I, \text{var}_U)$ as the (X,Y) pair, "a" is equivalent to $\text{ESR}^2$ and by taking the pair $(\sigma_I, \sigma_U)$ as the (X,Y) pair, "a" is equivalent to ESR. This relationship takes account of k pairs of values $(\text{var}_I, \text{var}_U)$ or $(\sigma_I, \sigma_U)$ corresponding to k measurement cycles carried out beforehand.

Moreover, a significant additional restriction can be applied to the linear regression by using the following relationship:

$$\overline{Y} = a\overline{X}$$

because the pair (U, I)=(0, 0) is theoretically found on the right-hand side.

By using this restriction, the linear regression formula becomes:

$$a = \frac{\frac{1}{k}\sum_1^k X_i Y_i}{\text{var}_x - \overline{X}^2} = \frac{\sum_1^k X_i Y_i}{\sum_1^k X_i^2}$$

Calculation of C

The linear regression that has just been described can be used for determining C by taking $\Delta Q$ for Y and "$\Delta U - \text{ESR} \times \Delta I$" for X, each $\Delta$ corresponding to a different pair of states (①, ②). The pairs of states (①, ②) could satisfy the conditions of choice stated in the preceding embodiment. They could equally well follow one another (sequence of the type ① ② ①' ②' ①" ②" . . . ), overlap (sequence of the type ① ①' ② ①" ②' ②" . . . ), be contiguous (sequence of the type ① ②=①" ②'=①" ②" . . . ), be regular or not (sequence of the type ① ①" ② ②"=①" ②" . . . ).

$\Delta Q$ can be obtained from the integration of I or $\overline{I}$ over the time interval which separates the states ① and ②.

In particular, access to the value of ESR is not immediate. This method is particularly suitable in the case of slow variation and/or low expected value[s] for ESR, which is the case in practice for a standard capacitive storage element.

This second embodiment (indirect calculation or linear regression) effectively corrects the problem of inaccuracy of the preceding embodiment by direct calculation but requires storage in memory and additional means of post-processing of the statistical variables obtained.

The linear regression method can be carried out:
either by calculating the necessary statistical variables ($\overline{U}$, $\text{var}_U$, $\sigma_U$, $\overline{I}$, $\text{var}_I$ or $\sigma_I$) and by storing these variables and then carrying out the linear regression;
or by having stored the measured pairs (I, U) directly, then by subsequently carrying out the steps of calculation of the auxiliary statistical variables which are then $\overline{U}$, $\text{var}_U$, $\sigma_U$, $\overline{I}$, $\text{var}_I$ or $\sigma_I$ and the step of linear regression.

In this second embodiment, it is preferable for the number of measurements to be large and for the time during which the measurements are taken to be greater than that of the first embodiment.

The measurements can be taken over several minutes or even several hours. This makes it possible to avoid falsifying the regression by having values only within a single domain of values of I and U. For the calculation, the set of pairs (I, U) measured will then be broken down into k subsets of $N_i$ pairs, taking care to respect the criteria relating to the time distribution and to the short time between the current and voltage measurements shown in embodiment 1 for each subset of measurements. No other condition is placed on the value of $N_i$, which can therefore be different from one subset to another.

Variants of the Second Embodiment

In the second embodiment, it is also possible to carry out the regression with k pairs of values (X, Y) in a sliding manner instead of taking k pairs of values in a set manner as described above. In this case, the periods of time for which the statistical variables are calculated overlap. Instead of carrying out a calculation every k pairs of values as proposed previously, it is possible to carry out a new calculation for each new pair of values (X,Y) by considering only the k last pairs of values. The oldest (X, Y) value is replaced by the new pair of (X, Y) values, The change in the value of ESR is then smoothed over time. In this variant of the second embodiment, k can be variable over time, i.e. the number of pairs of values can be variable over time. It is for example opportunely possible to group the (X, Y) pairs by range of the variation of X or of Y.

Moreover, regardless of the way in which the K pairs of values are taken into account (sliding or set), before storing a pair of measured/calculated values, this pair of values can be compared to the pairs of values already stored in order to determine if there may already be a pair of values that are identical or close. If this is the case, the new pair of values is not stored, if not, it is stored. Such a comparison makes it possible to avoid saturating the storage means and/or using storage means that are too expensive.

For example, in the variant embodiment of the second calculation method in which the k pairs of values are considered in a sliding manner, there is no guarantee in practice that these k pairs are sufficiently far apart in value for the result of the linear regression to be accurate. For example, if the set of the values of I or $\text{var}_I$ in question are close to 0, it is highly likely that the calculation of linear regression would give an inaccurate value. In order to correct this problem, the pairs of values can be selected before carrying out the linear regression calculation.

With such a selection, access to the ESR value becomes even less immediate than previously. This method is therefore particularly suitable in the case of slow variation and/or low expected values for ESR.

The principle of such a selection is the following: For each new value (X, Y), it is determined if this pair contributes an item of data that is beneficial from a statistical point of view. If this is the case, it is placed in the buffer memory. If not, it is disregarded for the calculation. An $(X_i, Y_i)$ contributes a statistically beneficial item of data if there is not already an equivalent pair in memory. This amounts to verifying that there is no $(X_j, Y_j)$ pair in memory, such that:
$\{X_j - \delta X/2 \leq X_i \leq X_j + \delta X/2 ; Y_j - \delta Y/2 \leq Y_i \leq Y_j + \delta Y/2$ with $\delta X/2$ and $\delta Y/2$ predetermined.

From a practical point of view, for each new pair of values $(X_j, Y_j)$, the theoretical position of storage in the memory is determined. If a pair is not already present at this site, the values are stored. If not, the pair of values is disregarded.

In order to determine the theoretical position of a pair of value $(X_i, Y_i)$, the field of variation of X is therefore divided into $n_x$ intervals of width $\delta X$ and the field of variation of Y into $n_Y$ intervals of width $\delta Y$: $n_X \times n_Y$ storage zones are reserved for storing the set of possible pairs of (X, Y) values.

There is thus a compromise to be found between the quantity of storable data and the acceptable values of $\delta X$ and $\delta Y$ with regard to the domains of variation of X and Y. It is not mandatory for the intervals to have a constant width over the entire domain of variation, but this is recommended in order to avoid complex statistical processing: a compromise between size of the storage means/power of the calculation means.

A variant of this selection mode can be to count the number of pairs of values in each of the $n_X \times n_Y$ cases in memory and to assign a weight (or coefficient) function of the number of pairs in the case at the value associated with this case. However, this solution which is statistically even more satisfactory than the previous one, increases the memory size requirement; because it is then necessary to use an additional table of integers.

It is also possible to store only a reduced number of values for Y for every value of X. In this case, the stored values must be statistically representative of the set of values of Y measured and/or calculated for every value of X in question. It can for example be envisaged to store a average, and/or a median, and/or a sum of the values and the corresponding number of values, and/or a minimum and a maximum, and/or a variance of the values, and/or a standard deviation of the values, and/or a sum of the squares of the values and the corresponding number of values, in order to limit the size required for storage of the values.

Due to the expected order of magnitude of ESR ($\leq 50$ milliohms), the calculation of $ESR^2$ (or ESR) gives a small value. This necessarily requires working with highly accurate real numbers. It can therefore be beneficial to work with the inverse of ESR $[ESR^{-1}]$ or the inverse of the square of ESR $[ESR^{-2}]$, which are large numbers capable of being represented by integers without consequent loss of accuracy. This is done simply by inverting the basic equations used and specified above.

Regardless of the method of calculation selected, the parameters SOC and SOH are for example then determined by using the following relationships:

$$SOC = \frac{E_S - E_L}{E_n - E_L}\% = \frac{C(U - ESR \times I)^2 - CU_L^2}{CU_n^2 - CU_L^2} \times 100\%$$

with $U_N$ and $U_L$ the high and low voltages of the element in operation, respectively.

$$SOH = \left(\frac{C - C_{init}}{C_{init}}\%, \frac{ESR - ESR_{init}}{ESR_{init}}\%\right)$$

with $C_{init}$ and $ESR_{init}$ the initial values of the characteristics C and ESR of the element in operation. It is commonly accepted that the element is at the end of [its] life when the parameter SOH reaches the value (−20%, 100%), i.e. when the element in operation shows a loss of 20% of its capacitance and a doubling of its ESR.

The embodiments or variants which have just been described can be adapted to the type of practical application sought.

Thus, in the case where the storage means operates continuously, without a separate operating phase, the measurements and calculations can be simple and carried out instantaneously. This scenario can for example use the direct calculation mode (embodiment 1) described above.

Thus, in the case where the storage means operates according to different phases, for example maximum operating rate then idle, a large number of items of data can be stored without processing and a complex calculation can be carried out at a non-critical moment, for example when the storage element is idle. This scenario can for example use the indirect calculation method (embodiment 2) described above.

For reasons of calculation performance and of simplification of the hardware used and a reduction of costs, it can even be beneficial to work with integer values. This means discretizing the scale of the measurements (to the real base even if the sensors, due to the digitization of the measurement, give an already discretized value of the measured variable) into a scale of integer values: it is then preferable to work with the inverse of ESR.

FIG. 1 is a diagrammatic representation of an example of a storage assembly according to the invention.

The storage assembly 100 shown in FIG. 1 comprises four capacitive energy storage elements $102_1$-$102_4$ linked together by an electrical circuit 104 and a device 106 for the characterization of each of the storage elements.

The storage elements $102_1$ and $102_2$ are mounted in series on a branch $104_1$ of the electrical circuit 104 and the elements $102_3$ and $102_4$ are mounted in series on a branch $104_2$ of the electrical circuit 104. The branches $104_1$ and $104_2$ are two parallel branches of one and the same electrical circuit 104.

The characterization device 106 comprises voltage measurement modules $108_1$-$108_4$ linked respectively to each energy storage element $102_1$-$102_4$. The device 100 comprises moreover a voltage measurement module 110 measuring the voltage at the terminals of each of the branches $104_1$ and $104_2$, corresponding also to the voltage at the terminals of the set of storage means 102.

The voltage measurement modules $108_1$-$108_4$ and 110 each comprise a voltage sensor which is a 0-5V analogue-to-digital converter ADC.

The voltage measurement module 110 comprises in addition, due to the nominal voltage Un of the module greater than 5 V, a voltage divider stage $110_1$ at the input of the sensor ADC $110_2$. The voltage divider is chosen here at ÷2, as the number of serial elements in each branch. The voltage divider stage $110_1$ can be produced passively, by combination of resistors and other passive components, or actively, by combination of passive components and active components of the transistor or operational amplifier type.

The device 100 comprises moreover current measurement modules $112_1$ and $112_2$ positioned respectively on each of the branches $104_1$ and $104_2$. The device 100 comprises moreover a module 114 for measurement of current passing through the set of storage means and positioned on a branch 116, called general branch, of the electrical circuit on which the branches $104_1$ and $104_2$ of the electrical circuit are joined.

The current measurement modules $112_1$ and $112_2$ and 114 use current sensors of different types.

The module 114 uses a multi-range Hall effect sensor $114_1$ because the high current values expected do not allow the use of a digital shunt. As the output signal of this sensor $114_1$ is an analogue voltage, the module 114 comprises a sensor ADC $114_2$ arranged downstream of the multi-range Hall effect sensor $114_1$.

The current measurement module $112_1$ arranged on the branch $104_1$ comprises a digital shunt with integrated measurement of the quantity of charges, including in particular a controllable reset, as the current values expected at the level of the branch $104_1$ are compatible with this technology.

The current measurement module $112_2$ arranged on the branch $104_2$ comprises a fluxgate magnetic sensor with a digital output, more advantageous than the digital shunt in terms of insulation but also more bulky, therefore more difficult to position in the circuit.

The current measurement modules $112_1$ and $112_2$ for the internal branches $104_1$ and $104_2$ therefore comprise only the current sensor as described above. The voltage measurement module $108_1$-$108_4$ comprises only the ADC sensor, the latter having an equivalent timeframe to each of the sensors of the current measurement module $112_1$ and $112_2$.

The voltage measurement module 110 comprises, in addition to the stage $110_1$ of the voltage divider and of the ADC sensor $110_2$ as described above, an analogue low-pass filter $110_3$ in order to render the timeframe of the voltage measurement taken equivalent to that of the current measurement module 114. In the embodiment described here, the analogue low-pass filter $110_3$ is situated between the output of the voltage divider stage $110_1$ and the input of the ADC sensor $110_2$. The analogue low-pass filter $110_3$ can be produced passively by combination of resistors, capacitors and other passive components, or actively, by combination of passive components and active components of the transistor or operational amplifier type. Although described and shown separately, the voltage divider stage $110_1$ and the analogue low-pass filter $110_3$ can be grouped/integrated in one and the same electrical circuit.

The device 100 comprises in the current measurement module 114, in addition to the components $114_1$ and $114_2$ described above, an analogue integrator stage at the output which makes it possible to supply a measurement of the quantity of charge having flowed in the storage assembly formed by the storage elements 102, since the last reset command. This integration stage comprises an analogue integrator $114_3$ which integrates a reset command and an ADC sensor $114_4$, positioned in series with the analogue integrator $114_3$, which converts the integrated analogue signal into a digital signal. The analogue integrator $114_3$ can be produced passively, by combination of resistors, capacitors and other passive components, or actively, by combination of passive components and of active components of the transistor or operational amplifier type.

The device 100 comprises moreover a temperature sensor 116 and a pressure sensor 118. These sensors take measurements of temperature and pressure in the module, taken into account in a common manner for all the storage elements 102. They are of known types and no further detail is provided of their composition.

The device 106 comprises a central processing unit 120, linked to all the measurement modules 108-114 and to all the sensors 116-118.

It comprises a memory 122 intended for storing the values measured by the sensors described above. The memory 122 stores the values relating to each storage element 102 separately and independently. The memory 122 also stores the temperature and pressure values, and a conversion table allowing the current and voltage values measured to be restored to actual conditions, determined using pressure and temperature measurements at values within the reference conditions.

The central processing unit 120 also comprises calculation means 124, comprising for example one or more microcontrollers, making it possible to process the data obtained from the measurement modules, according to predetermined calculation algorithms, in particular as described above, and pre-programmed into the calculation means in order to obtain the values of the following statistical variables: firstly ESR and C, then SOC and SOH, etc.

The central processing unit 120 comprises moreover a control means 126, also called control unit, comprising in particular a clock $126_1$, configured to control the set of modules measuring voltage, current, temperature and pressure and to initiate the set of measurements by the different measurement modules. Alternatively, the device according to the invention can comprise a different control unit dedicated to each measurement module.

In order to optimize the calculation time, the central processing unit 120 also comprises calculation means 128 dedicated to the digital time-integration of the current measurements originating from the fluxgate magnetic sensor $112_2$. The purpose of the calculation means 128 is to calculate the measurements of the quantity of charge $\Delta Q$ from the current measurements I. It is also possible to use the calculation means 124 to carry out this operation, without the need to use dedicated calculation means.

In the embodiment described here, the means 122, 124, 126 and 128 of the central processing unit 120 can communicate between each other digitally and bidirectionally within the central processing unit 120. In particular, the dedicated calculation means 128 are linked to the control unit 126, to the calculation means 124 and to the memory 122. In particular, the calculation means 124 are linked to the control unit 126 and to the memory 122.

In the embodiment described here, the central processing unit 120, and more particularly the control unit 126, can communicate with all of measurement modules. The modules comprising digital sensors communicate digitally with the central processing unit 120. The current sensor multi-range Hall-effect analogue control 1141 imposes an analogue communication in the down direction, i.e. from the central processing unit 120 to the measurement module 114 in parallel with a digital communication in the up direction, i.e. from the measurement module 114 to the central processing unit 120.

The temperature and pressure measurement sensors 116 and 118 communicate with the central processing unit 120 in an analogue and/or digital manner as a function of the choice of sensor. The communication is essentially used in the up direction, i.e. from the sensor to the central processing unit 120. In the embodiment described, the communication is analogue in both directions, which assumes the presence of analogue-to-digital conversion means (not shown) at the input of these signals within the central processing unit 120.

The storage assembly 100 shown in FIG. 1 comprises in addition to the storage elements $102_1$-$102_4$ and the characterization device 106, a balancing unit 130 of the different energy storage elements $102_1$-$102_4$ as a function of the data supplied by the characterization device 106 and more particularly by the central processing unit 120 of the characterization device 106.

This balancing unit 130 acts on the storage means $102_1$-$102_4$ as a function of the data obtained by the characterization device 106 and stored in the storage means 122.

This balancing unit 130 is linked/connected to the memory 122.

Although shown independently of the central processing unit 120 in FIG. 1, the balancing unit 130 can preferentially be incorporated in the central processing unit 120.

In FIG. 1, the connections in solid lines symbolize analogue connections and the connections in dashed lines, symbolize digital connections.

Figure 2:
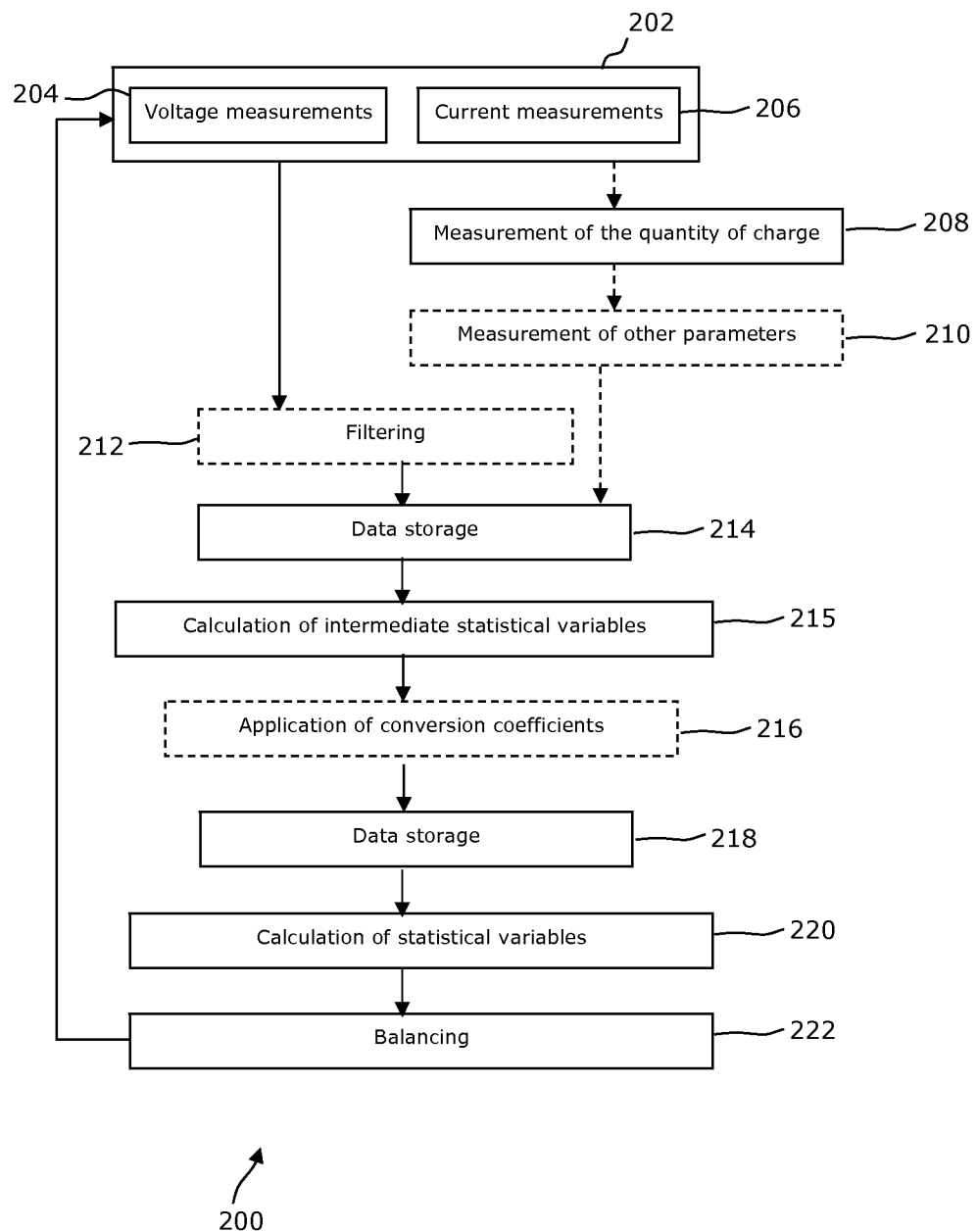
FIG. 2 is a diagrammatic representation of a method of characterization according to the invention.

FIG. 2 is a diagrammatic representation of an embodiment of a method of characterization of a capacitive storage element, according to the invention.

The method 200 shown in FIG. 2 comprises a step 202 carrying out a measurement cycle for a storage element, for example each storage element $102_i$, or for a group of storage elements, for example the group comprising the storage elements $102_1$ and $102_2$ or the group comprising the storage elements $102_3$ and $102_4$ or also the group comprising all the storage elements $102_1$-$102_4$.

The step 202 comprises a step 204 taking a series of voltage measurements for each element/group with a voltage measurement module, for example a module 108 or the module 110 of the device of FIG. 1.

The step 202 also comprises a step 206, carried out at least partially at the same time as the step 204, and taking a series of current measurements for each element/group with a current measurement module, for example a module 112 or the module 114 of the device of FIG. 1.

The voltage and current measurement are taken in an alternating/interleaved manner by the measurement module associated with each element/group.

Each of the measurement steps 204 and 206 is carried out for example so that a measurement is taken every 5 milliseconds by each sensor, in an interleaved manner.

Each measurement step or both measurement steps can be carried over a total period of 40 milliseconds. Thus, a set of eight voltage values and eight current values is obtained for each element/group during each measurement cycle 202. The measurements, and as a result the measurement modules, can be initiated by a control unit such as the control unit 126 of the device 106 of FIG. 1.

The current and voltage measurement are taken so that the series of current measurements and the series of voltage measurements are taken over two overlapping periods over a duration greater than or equal to 70% of the total measurement period.

The method 200 also comprises a step 208 of measurement of the quantity of charge $\Delta Q$. This step 208 can be carried out before, during or after a measurement cycle 202. Such a step 208 can be carried out, for example by the control unit 126, and by means of:
- a digital signal emitted to a current sensor, for example the current sensor 1121 which has a specific integrated sensor, or
- an analogue signal to an integration stage of a current measurement module, for example the integration stage of the current measurement module 114, and by an analogue reset of said integration stage, or
- a digital signal to the dedicated calculation means linked to a current measurement module, for example the current measurement module $112_2$ and the dedicated calculation means of said module 128, and by a digital reset of said dedicated calculation means.

The measurement of the quantity of charge or the integration of the current is then taken during a predetermined period of 8 seconds for example and supplies a value of the quantity of charge, for each current measurement module used.

The method also comprises an optional step 210, of periodic measurement of other parameters such as the temperature, the pressure, etc. The periodicity of taking measurements is 40 seconds for example.

The measurements taken can be filtered in an analogue manner in the case of certain sensors, for example the voltage sensor 110 of FIG. 1, during an optional step 212.

During a step 214, the measurements taken are transferred to a storage means for example the storage means 122 of FIG. 1, and are stored in association with each element or group of energy storage elements.

The stored data are then extracted and used during a calculation step 215, for example by means of the calculation means 124, for each of the energy storage elements/group:
intermediates statistical variables such as:
the average of voltage U and of current I for each series of 8 values, which supplies a value for each measurement cycle of 40 milliseconds,
the variance of U and of I for each series of eight values, which supplies a value for each measurement cycle of 40 milliseconds,
the variation of the corrected voltage of the ohmic drop $\Delta V = \Delta U - ESR \times \Delta I$, which supplies a value for each measurement cycle of 8 seconds, a value that is necessarily approximate since the calculation uses for this purpose stored values of the statistical variable ESR that are not updated. These values are subsequently used by making them correspond to each measurement of the quantity of charge $\Delta Q$, such a measurement being taken over a plurality of cycles of voltage and current measurements, so that the capacitive effect is taken into account,
statistical variables such as:
the SOC, using predetermined formulae mentioned above, which supplies a value for each measurement cycle of 40 milliseconds, a value that is necessarily approximate, since the calculation uses for this purpose stored values for statistical variables that are not updated.

For these latter values, it is therefore necessary to know values of ESR and C, which assumes the storage of initial values on startup of the application. These values are obtained from the data obtained during a previous calculation of ESR and C or, failing that, theoretical values, for example on start up of the method 200.

The method 200 then comprises an optional step 216, applying conversion coefficients to the calculated values. These conversion coefficients are previously given in a conversion table stored in storage means and are identified by means of the measurements of other parameters such as the temperature, the pressure, etc. taken during the time interval corresponding to the measurements for which the averages, variances, variations and other statistical variables have been calculated. The measurement of these other parameters has been carried out periodically during the optional step 210 described above. As the periodicities of measurement of these parameters are different, the values of these parameters taken into account are the last values measured at the time of the measurement of the voltage U and current I. The calculated and optionally corrected values are stored in the storage means during a step 218.

When a predetermined number k of measurement cycles or of measurements have been carried out, for example when k=32000 measurements of voltage U and of current I over 160 seconds, i.e. 4000 values of pairs ($var_U$, $var_I$), 20 values of pairs ($\Delta Q$, $\Delta V$) and 4 values of each of the other parameters (temperature, pressure, etc.), and the results of the measurements/calculations carried out have been stored in the storage means, the method 200 can comprise a step 220 of calculation by linear regression over the k measurement cycles or k numbers of measurements, using the predetermined formulae mentioned above, in particular in a sliding manner as described above. The step 220 supplies updated values of ESR, C and SOH and optionally of SOC for each element/group of the energy storage elements. These updated values are stored in the storage means at the end of step 220 and are therefore taken into account for a future cycle of the method 200 as stated above.

Figure 3:
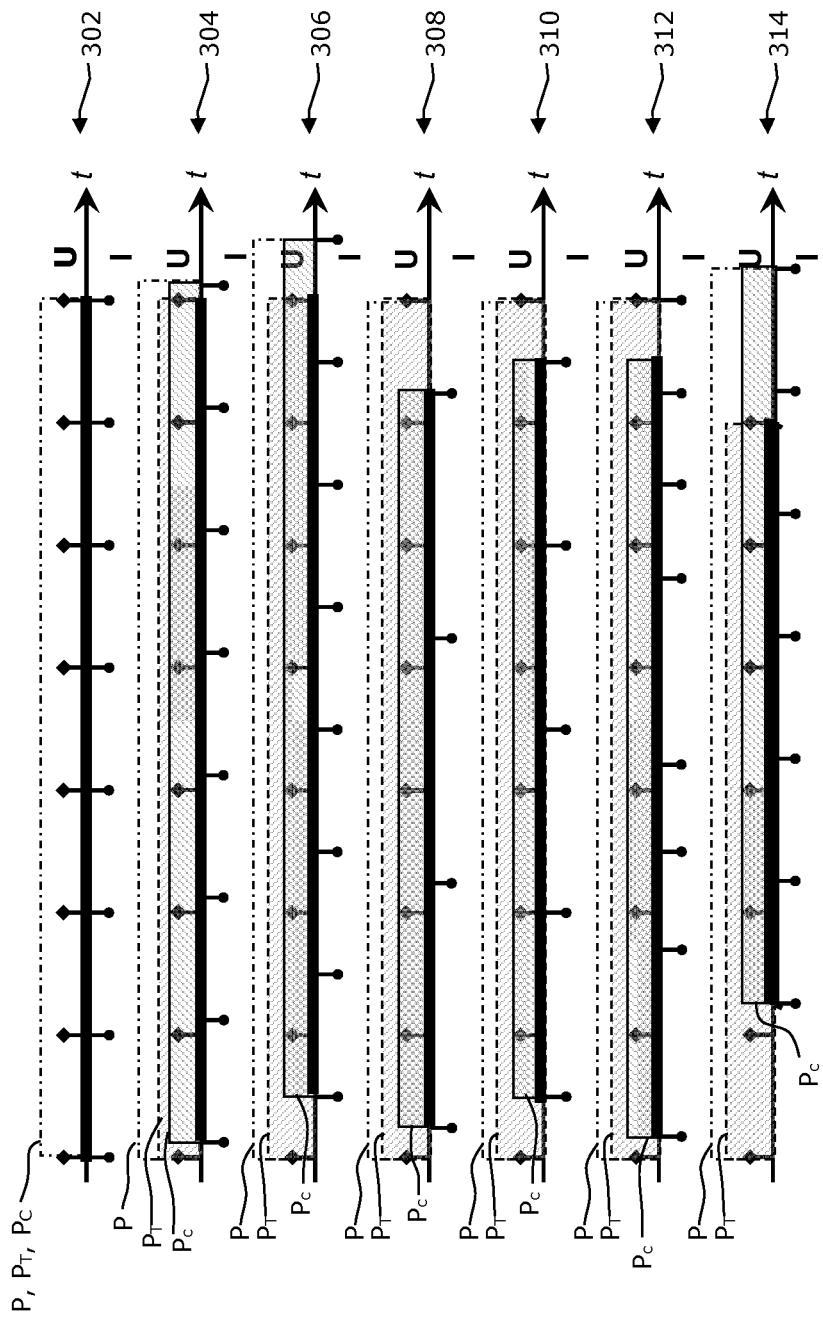
FIG. 3 is a diagrammatic representation of several configurations for the implementation of interleaved measurements of voltage and current according to the invention.

The method comprises moreover a step 222 carrying out a balancing using the different voltage, current, capacitance, resistance and SOC data obtained for each of the energy storage elements of a storage assembly comprising a plurality of storage elements. Such a balancing step can be carried out via a balancing unit, such as the balancing unit 130 of FIG. 1. The balancing step is carried out as a function of predetermined balancing rules relating to at least one of the aforementioned parameters, FIG. 3 is a diagrammatic, non-limitative representation of several configurations for the implementation of interleaved measurements of voltage and current according to the invention.

On all the configurations described, $P_\tau$ denotes the voltage measurement period for a series of voltage measurements, $P_C$ denotes the current measurement period for a series of current measurements and P denotes the total period comprising both the voltage period $P_\tau$ and the current period $P_C$. In all the configurations described below $P_\tau$ and $P_C$ overlap in time over a duration greater than or equal to 70% of P.

In the configuration 302, the voltage and current measurements are taken synchronously such that, for each voltage measurement, a current measurement is taken. In this configuration, $P_\tau = P_C = P$. As a result the voltage measurement period for taking a series of voltage measurements and the current measurement period for taking a series of current measurements overlap for 100% of the total period. In addition, the duration between two consecutive voltage measurements is equal to the duration between two consecutive current measurements, i.e. the voltage measurement frequency is equal to the current measurement frequency, In the configuration 304, the voltage and current measurements are taken in a staggered manner such that, for each voltage measurement, a current measurement is taken over a time interval Δt after the voltage measurement. In this configuration, $P_\tau = P_C$ and Δt is very short compared to P. In addition, Δt is also very short compared to the duration between two consecutive voltage measurements (or two consecutive current measurements). In addition, the duration between two consecutive voltage measurements is equal to the duration between two consecutive current measurements, i.e. the voltage measurement frequency is equal to the current measurement frequency.

In the configuration 306, the voltage and current measurements are taken alternately such that, for each voltage measurement, a current measurement is taken Δt afterwards. In this configuration, $P_\tau = P_C$ and Δt is equal to half the duration between two consecutive voltage (or current) measurements. In addition, the duration between two consecutive voltage measurements is equal to the duration between two consecutive current measurements, i.e. the voltage measurement frequency is equal to the current measurement frequency.

In the configuration 308, the voltage and current measurements are taken in a staggered manner and with different measurement frequencies. The total measurement period P starts and finishes with a voltage measurement, therefore $P_\tau = P$. In addition, for each current measurement taken, two voltage measurements are taken. Each current measurement is taken at a time interval Δt after a voltage measurement, with Δt very short compared to P, $P_\tau$ and $P_C$. In addition, the duration between two consecutive voltage measurements is half the duration between two consecutive current measurements, i.e. the voltage measurement frequency is equal to twice the current measurement frequency.

In the configuration 310, the voltage and current measurement are taken in a synchronous, alternating manner and with different measurement frequencies. The total measurement period P starts and ends with a voltage measurement, therefore $P_\tau = P$. The first current measurement is taken a time interval Δt after the first voltage measurement with Δt equal to half the duration between two voltage measurements. In addition, for each current measurement taken, two voltage measurements are taken, in the knowledge that the duration between two consecutive voltage measurements is equal to ⅔ of the duration between two consecutive current measurements, i.e. the voltage measurement frequency is equal to 1.5 times the current measurement frequency.

In the configurations 302-310 the voltage measurement frequency and the current measurement frequency are each constant.

In the configuration 312, the voltage and current measurements are taken in a staggered manner and with measurement frequencies that are not constant over time, only for the current measurement in said configuration but presented non-limitatively. The total measurement period P starts and ends with a voltage measurement, therefore $P_\tau = P$. For each voltage measurement, a current measurement is taken a time Δt after the voltage measurement. In this configuration 312, the time interval Δt is not constant and changes for each measurement and is even zero for the last current measurement which is taken at the same time as the last voltage measurement.

In the configuration 314, the voltage and current measurement are taken in a staggered manner and with a delay in the initiation of one of the measurement series, of current in said configuration but presented non-limitatively. The total measurement period P starts with a voltage measurement and ends with a current measurement. The measurement period comprises a first voltage measurement then a second voltage measurement and starting from the second voltage measurement a current measurement after each voltage measurement. The measurement period ends with a current measurement followed by another current measurement without a voltage measurement being taken. In this configuration 312, the measurement frequencies of voltage and current are equal and constant. The voltage measurement period is staggered from the current measurement period by a duration equal to the duration between two consecutive voltage (or current) measurements and by a constant duration Δt separating the second voltage measurement and the first current measurement (or the last voltage measurement and the penultimate current measurement), Of course, the invention is not limited to the examples that have just been described. The examples described may be subject to numerous variants. For example, the conversion 218 and balancing 222 steps can be carried out at different moments of the calculation method 200 described in FIG. 2 and/or several times during said method. Similarly, the optional filtering step 212 can be carried out digitally, for example by the calculation means 124 of FIG. 1. Similarly, the step 215 of calculation of the intermediate statistical variables is not a mandatory step and the step of calculation of statistical variables 220 may stand alone, then incorporating all or part of the calculations carried out during the step 215 as well as supplementary calculations, as described above in embodiment 1: Direct calculation. In this case, the storage steps 214 and 218 can also be grouped in a single step, for example the storage step 218, as a function of the presence of the optional conversion step 216, In addition, the configurations of measurements can be different to those described with reference to FIG. 3.

The invention claimed is:

1. A device for characterizing at least one element for storing energy via capacitive effect, said device comprising:
at least one voltage measurement module comprising at least one means of measurement, called voltage sensor, of the voltage of said element;
at least one current measurement module comprising at least one means of measurement, called current sensor, of the current of said element, said voltage measurement and current measurement modules being configured to carry out measurements with response dynamics of the same order of magnitude, i.e. the unit-step responses of said modules are of the same temporal order of magnitude;
at least one control means of said measurement modules for carrying out, for each storage element, at least one measurement cycle comprising:
a series of voltage measurements at the terminals of said storage element over a time period, called voltage measurement period; and
a series of measurements of the current passing through said storage element over a time period, called current measurement period; and
at least one means of statistical calculation of a variable relating to each storage element from the measurements taken during at least one measurement cycle by said modules;
in which said at least one control means is moreover configured to control said measurement modules so that, for each storage element, said voltage measurement period and said current measurement period overlap in time at least over 70%, of a period, called total period, comprising said measurement periods for said storage element.

2. The device according to claim 1, characterized in that the control module is configured to control a voltage measurement module, respectively a current measurement module, in order to carry out a series of voltage, respectively current, measurements, at a frequency greater than or equal to 10 Hz, in particular 200 Hz.

3. The device according to claim 1, characterized in that at least one current sensor comprises:
a digital resistive sensor; or
a Hall-effect multi-range sensor; or
a fluxgate magnetic sensor.

4. The device according to claim 1, characterized in that at least one voltage sensor comprises an analogue-to-digital converter configured to carry out analogue-digital conversion of a voltage presented at its input.

5. The device according to claim 1, characterized in that at least one voltage measurement module, respectively current measurement module, associated with a storage element comprises at least one means for changing a dynamic response of the sensor of said module by processing:
the electrical signal to be measured supplied at the input of said sensor; and/or
of a measurement signal supplied at the output by said sensor;
so as to adjust the dynamic response of said voltage sensor, respectively current sensor, with respect to a dynamic response of the current sensor, respectively voltage sensor, of the current measurement module, respectively voltage measurement module, associated with said storage element.

6. The device according to claim 1, characterized in that the control module is configured to control the voltage measurement module and the current measurement module associated with a storage element so as to carry out interleaved current and voltage measurements.

7. The device according to claim 1, characterized in that the total period of a measurement cycle is less than or equal to 1 s, in particular less than or equal to 0.2 s.

8. The device according to claim 1, characterized in that it comprises moreover a module for the measurement of the quantity of charge, comprising a means of measuring a quantity of charge, called a charge sensor, of the storage element.

9. The device according to claim 1, characterized in that it comprises moreover a buffer memory for storing at least a part of the values measured by the measurement modules during a measurement series or calculated by the calculation means.

10. The device according to claim 9, characterized in that it comprises means of comparing measured and/or calculated values with the values stored in the buffer memory, the Previously Presented measured and/or calculated values being stored in the buffer memory as a function of the results supplied by the comparison means.

11. The device according to claim 1, characterized in that the calculation means is configured to calculate at least one statistical variable from the values measured by the measurement modules over a single measurement cycle.

12. The device according to claim 1, in which the calculation means is configured to calculate at least one statistical variable from the values measured by the measurement modules over a plurality of measurement cycles.

13. The device according to claim 1, characterized in that it comprises at least one means of measuring other parameters relating to each energy storage element, and a means for converting the values measured under real conditions into values measured under reference conditions.

14. An energy storage assembly comprising:
a plurality of elements for storing energy via capacitive effect mounted in series and/or in parallel; and
a characterization device according to claim 1 supplying at least one item of characterization data for at least one of said energy storage elements.

15. The storage assembly according to claim 14, characterized in that it comprises a means for modifying a balance of the storage elements as a function of at least one item of data supplied by the characterization device.

16. A method for characterizing at least one element for storing energy via capacitive effect, said method being characterized in that it comprises, for each storage element:
at least one iteration of the following steps constituting a measurement cycle:
a series of voltage measurements taken by a voltage measurement module comprising at least one measurement means, called voltage sensor, of a voltage at the terminals of said storage element; and
a series of current measurements taken by a current measurement module comprising at least one measurement means, called current sensor, of a current passing through said storage element; and a step of statistical calculation of a variable relating to said storage element from said voltage and current measurements;

in which said series of voltage measurements and current measurement are carried out over two measurement periods which overlap in time at least over 70%, of a period, called total period, comprising said measurement periods, the measurements being carried out using voltage and current measurement modules having dynamic responses of the same order of magnitude.

17. The method according to claim 16, characterized in that it comprises at least one step of modification of a response dynamic of at least one voltage sensor or one current sensor, in order to obtain statistically compatible voltage and current measurements, said modification step comprising at least one processing:

of the electrical voltage or current to be measured supplied at the input of said sensor; and of a measurement signal supplied at the output by said sensor.

* * * * *